(12) United States Patent
Gao et al.

(10) Patent No.: US 11,778,733 B2
(45) Date of Patent: Oct. 3, 2023

(54) SIGNAL TRANSMISSION CIRCUIT PACKAGING STRUCTURE

(71) Applicant: LeRain Technology Co., Ltd., New Taipei (TW)

(72) Inventors: Miaobin Gao, New Taipei (TW); Chia-Chi Hu, New Taipei (TW)

(73) Assignee: LERAIN TECHNOLOGY CO., LTD., New Taipei (TW)

(*) Notice: Subject to any disclaimer, the term of this patent is extended or adjusted under 35 U.S.C. 154(b) by 143 days.

(21) Appl. No.: 17/553,877

(22) Filed: Dec. 17, 2021

(65) Prior Publication Data

US 2022/0312580 A1   Sep. 29, 2022

Related U.S. Application Data

(60) Provisional application No. 63/165,974, filed on Mar. 25, 2021.

(30) Foreign Application Priority Data

Aug. 20, 2021   (TW) .................................. 110130875

(51) Int. Cl.
*H05K 1/02* (2006.01)
*H04B 1/04* (2006.01)

(52) U.S. Cl.
CPC .............. *H05K 1/0228* (2013.01); *H04B 1/04* (2013.01); *H05K 1/0243* (2013.01)

(58) Field of Classification Search
CPC ....... H05K 1/0228; H05K 1/0243; H04B 1/04
See application file for complete search history.

(56) References Cited

U.S. PATENT DOCUMENTS

| | | | |
|---|---|---|---|
| 6,400,019 B1* | 6/2002 | Hirashima | H01L 23/49816 257/737 |
| 6,548,907 B1* | 4/2003 | Yamada | H01L 23/50 257/E23.079 |
| 6,770,493 B2* | 8/2004 | Baker | H05K 1/029 257/E23.079 |
| 7,214,886 B2* | 5/2007 | Audet | H01L 23/49822 257/E23.079 |
| 10,595,394 B1* | 3/2020 | Kim | H05K 1/113 |
| 2013/0003333 A1* | 1/2013 | Toyao | H05K 1/0298 361/777 |
| 2017/0105284 A1* | 4/2017 | Akagawa | H05K 1/111 |
| 2018/0158490 A1* | 6/2018 | Hovmoller | G11C 5/025 |
| 2018/0270942 A1* | 9/2018 | Kawaguchi | H01P 3/081 |
| 2021/0202907 A1* | 7/2021 | Lee | H10K 59/10 |
| 2022/0189891 A1* | 6/2022 | Matsumaru | H01Q 1/2283 |

* cited by examiner

Primary Examiner — Hoag Nguyen
(74) Attorney, Agent, or Firm — Muncy, Geissler, Olds & Lowe, P.C.

(57) ABSTRACT

A signal transmission circuit packaging structure is disclosed. The signal transmission circuit packaging structure includes a body, a main circuit unit, power pins, input pins, output pins, control pins, and ground pins. The main circuit unit is arranged in the center of the body. The power pins supply power signal to the main circuit unit. The input pins and the output pins are arranged on a first and a second side of the body separately for electrically connecting to the main circuit unit. The control pins are arranged on the second side of the body and electrically connected to the main circuit unit. The ground pins are arranged at corners of the body to separate the input pins, the output pins, and the control pins.

10 Claims, 4 Drawing Sheets

US 11,778,733 B2

SIGNAL TRANSMISSION CIRCUIT PACKAGING STRUCTURE

BACKGROUND OF THE INVENTION

1. Field of the Invention

The present invention relates to a signal transmission circuit packaging structure, and more particularly to a signal transmission circuit packaging structure capable of separating signal transmission paths of different speeds so as to prevent interference.

2. Description of the Related Art

With the progress of technology, the transmission speed of data communication is increasing. Both communication equipment and data server equipment must be capable of high-speed data transmission. Conventionally, a transmission speed of 32 Gb/s can be achieved by means of PCIe Gen5, and a transmission speed of 64 Gb/s can be achieved by means of PCIe Gen6. However, in such a high-speed transmission environment, the estimation of path loss is very important. Therefore, the design of the package structure of the integrated circuit is a key factor in high-speed data transmission Therefore, it is necessary to create a novel signal transmission circuit packaging structure for solving the issues of the prior art.

SUMMARY OF THE INVENTION

The primary object of the present invention is to provide a signal transmission circuit packaging structure which is capable of separating signal transmission paths of different speeds so as to avoid interference.

To achieve the object described above, a signal transmission circuit packaging structure of the present invention includes a body, a main circuit unit, a plurality of power pins, a plurality of input pins, a plurality of output pins, and a plurality of control pins. The body includes a first side and a second side, wherein the first side is adjacent to the second side. The main circuit unit is arranged in the center of the body. The plurality of power pins are arranged in the center of the body and supply a power signal to the main circuit unit. The plurality of input pins are arranged at the first side and the second side of the body and are electrically connected to the main circuit unit. The plurality of output pins are arranged at the first side and the second side of the body and are electrically connected to the main circuit unit. The plurality of control pins are arranged at the second side and electrically connected to the main circuit unit. The plurality of ground pins are arranged at corners of the body and arranged between the plurality of input pins, the plurality of output pins, and the plurality of control pins so as to separate the plurality of input pins, the plurality of output pins, and the plurality of control pins.

DETAILED DESCRIPTION OF THE PREFERRED EMBODIMENT

Preferred specific embodiments are given below to better describe the technical contents of the present invention.

Figure 1A:
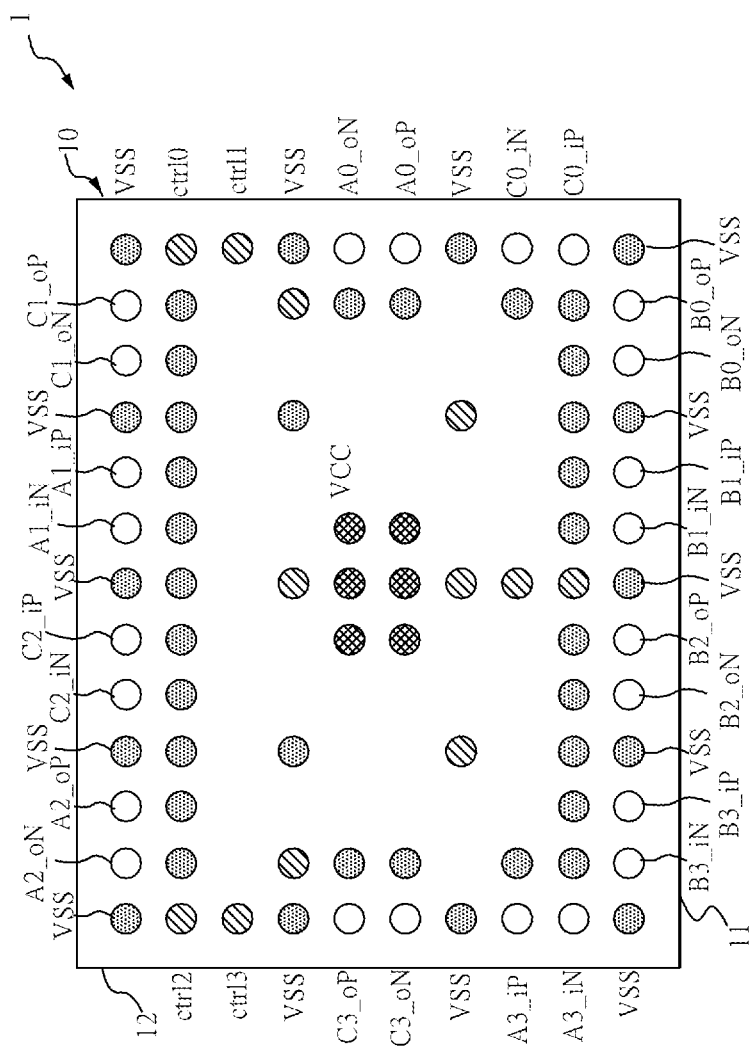
FIG. 1A is a schematic diagram of a pin layout of a signal transmission circuit packaging structure of the present invention.

Please refer to FIG. 1A, which shows a schematic diagram of a pin layout of a signal transmission circuit packaging structure of the present invention.

In an embodiment of the present invention, a signal transmission circuit packaging structure 1 is adapted to be electrically connected to other electronic modules so as to transmit electrical signals. The transmission mode of electrical signals may be implemented in the form of single-ended signals or differential signals; however, the present invention is not limited thereto. In embodiments of the present invention, descriptions are given in the form of differential signals. It should be noted that, although the terms "first" and "second" are used to describe various elements of the present invention, these terms are not to be construed as limitations of the elements. Such terms are used merely for differentiating one element from another element. For example, without departing from the scope of the various embodiments described, a first input pin may be referred to as a second input pin, and similarly, a second input pin may be referred to as a first input pin. Moreover, the first input pin and the second input pin are both input pins but are not the same input pin.

Figure 1B:
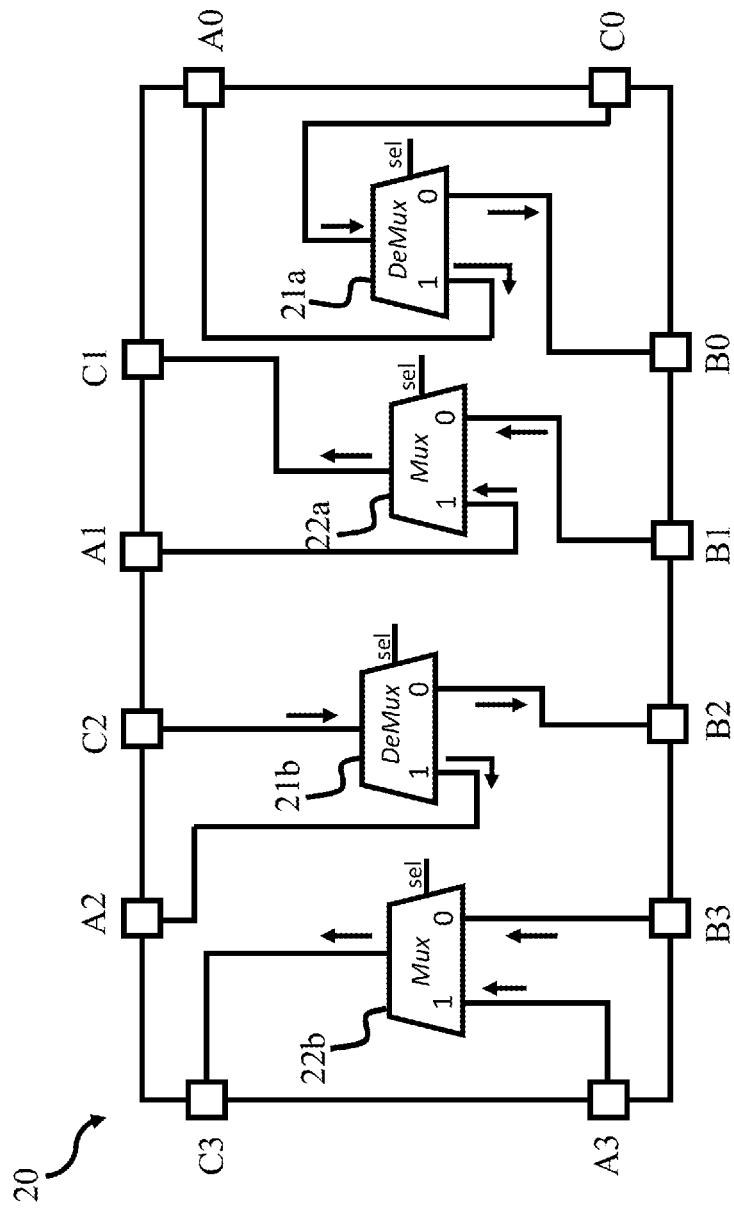
FIG. 1B is a structure diagram of a main circuit unit of a signal transmission circuit packaging structure of the present invention.

The signal transmission circuit packaging structure 1 includes a body 10, a main circuit unit 20 (as shown in FIG. 1B), a plurality of power pins VCC, a plurality of input pins A1_iP, A1_iN, A3_iP, A3_iN, B1_iP, B1_iN, B3_iP, B3_iN, C0_iP, C0_iN, C2_iP, C2_iN, a plurality of output pins A0_oP, A0_oN, A2_oP, A2_oN, B0_oP, B0_oN, B2_oP, B2_oN, C1_oP, C1_oN, C3_oP, C3_oN, a plurality of control pins ctrl0, ctrl1, ctrl2, ctrl3, and a plurality of ground pins VSS. The body 10 may be a single-layer or multi-layer circuit board and includes a first side 11 and a second side 12, wherein the first side 11 is adjacent to the second side 12. The main circuit unit 20 is arranged in the center of the body 10 and may be arranged on a layer of the circuit board other than a layer to which other pins are connected. The main circuit unit 20 includes demultiplexer circuits 21a, 21b and multiplexer circuits 22a, 22b; however, the present invention is not limited thereto. The plurality of power pins VCC are arranged in the center of the body 10 and supply a power signal to the main circuit unit 20. The plurality of input pins A1_iP, A1_iN, A3_iP, A3_iN, B1_iP, B1_iN, B3_iP, B3_iN, C0_iP, C0_iN, C2_iP, C2_iN are arranged at the first side 11 and the second side 12 of the body 10 and electrically connected to the main circuit unit 20. The plurality of output pins A0_oP, A0_oN, A2_oP, A2_oN, B0_oP, B0_oN, B2_oP, B2_oN, C1_oP, C1_oN, C3_oP, C3_oN are arranged at the first side 11 and the second side 12 of the body 10 and electrically connected to the main circuit unit 20. The transmission signal is inputted from the plurality of input pins to the main circuit unit 20 and then transmitted to the plurality of output pins. The input pins C0_iP, C0_iN and the output pins A0_oP, A0_oN are arranged at the same side of the body 10; the input pins C0_iP, C0_iN and the output pins B0_oP, B0_oN are arranged at the adjacent side of the body 10. The input pins A1_iP, A1_iN and the input pins B1_iP, B1_iN are arranged at the opposite sides of the body 10; the input pins A1_iP, A1_iN and the output pins C1_oP, C1_oN are arranged at the same side of the body 10. The input pins C2_iP, C2_iN and the output pins A2_oP, A2_oN are arranged at the same side of the body 10; the input pins C2_iP, C2_iN and the output pins B2_oP, B2_oN are arranged at the opposite sides of the body 10. The input pins A3_iP, A3_iN and the input pins B3_iP, B3_iN are arranged at the adjacent side of the body 10; the input pins A3_iP, A3_iN and the output pins C3_oP, C3_oN are arranged at the same side of the body 10. Thus, the main circuit unit 20 can be connected with reduced transmission path lengths to external electronic modules directly via the input pins A1_iP, A1_iN, A3_iP, A3_iN, B1_iP, B1_iN, B3_iP, B3_iN, C0_iP, C0_iN, C2_iP, C2_iN and the output pins A0_oP, A0_oN, A2_oP, A2_oN, B0_oP, B0_oN, B2_oP, B2_oN, C1_oP, C1_oN, C3_oP, C3_oN.

Please refer to FIG. 1B, which shows a structure diagram of a main circuit unit of a signal transmission circuit packaging structure of the present invention.

In the embodiment of the present invention, the main circuit unit 20 has two demultiplexer circuits 21a, 21b and two multiplexer circuits 22a, 22b, so as to be applied to three electronic modules. The input ports C0, C2 of the demultiplexer circuits 21a, 21b are connected to the input pins C0_iP, C0_iN, C2_iP, C2_iN, the output ports A0, A2 are connected to the output pins A0_oP, A0_oN, A2_oP, A2_oN, and the output ports B0, B2 are connected to the output pins B0_oP, B0_oN, B2_oP, B2_oN. The input ports A1, A3 of the multiplexer circuits 22a, 22b are connected to the input pins A1_iP, A1_iN, A3_iP, A3_iN, the input ports B1, B3 are connected to the input pins B1_iP, B1_iN, B3_iP, B3_iN, and the output ports C1, C3 are connected to the output pins C1_oP, C1_oN, C3_oP, C3_oN. The plurality of input pins A1_iP, A1_iN, A3_iP, A3_iN, B1_iP, B1_iN, B3_iP, B3_iN, C0_iP, C0_iN, C2_iP, C2_iN and the plurality of output pins A0_oP, A0_oN, A2_oP, A2_oN, B0_oP, B0_oN, B2_oP, B2_oN, C1_oP, C1_oN, C3_oP, C3_oN are pins for high speed transmission, and all are arranged on the edge of the body 10 in order to match the layout of the demultiplexer circuits 21a, 21b and the multiplexer circuits 22a, 22b so as to reduce the distances of the signal transmission paths.

The plurality of power pins VCC are arranged in the center of the body 10, as shown in FIG. 1A, so as to receive the transmitted power signal more conveniently. The plurality of control pins ctrl0, ctrl1, ctrl2, ctrl3 are low-speed transmission pins and are arranged at the edge of the body 10 so as to transmit control signals to the demultiplexer circuits 21a, 21b and the multiplexer circuits 22a, 22b. The plurality of ground pins VSS are arranged on the edge of the body 10b and are used for separating the plurality of input/output pins and for separating the plurality of input/output pins and the plurality of control pins ctrl0 to ctrl3 so as to avoid signal interference among pins.

Figure 2:
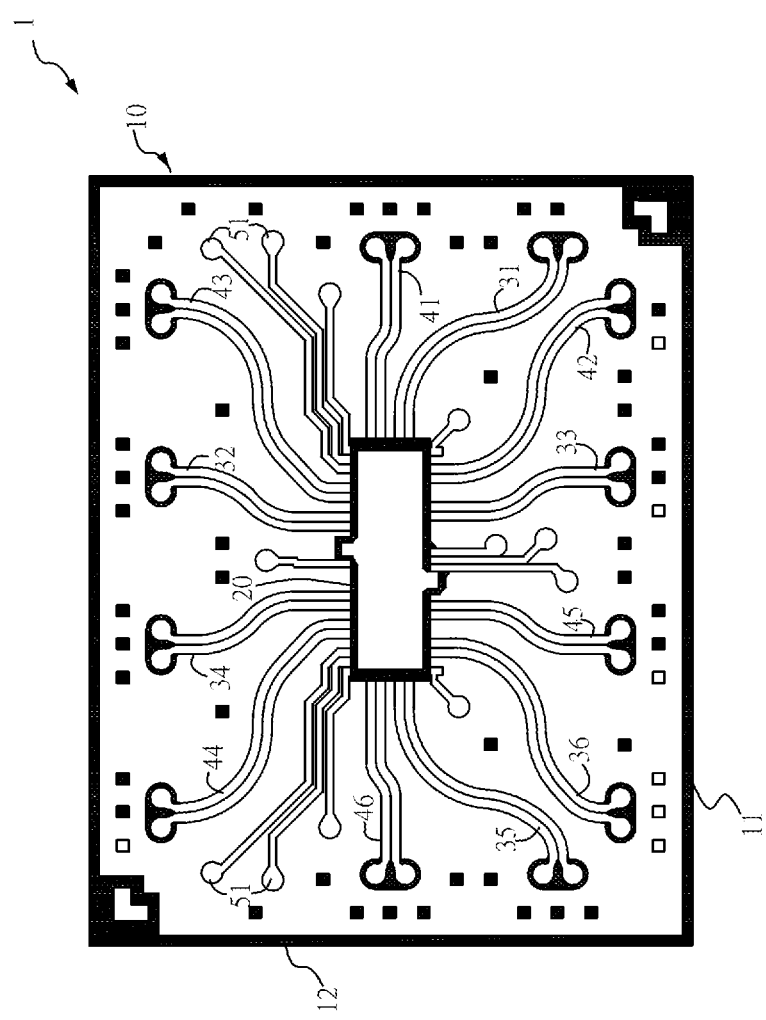
FIG. 2 is a schematic diagram of transmission channels of a signal transmission circuit packaging structure of the present invention.

Please refer to FIG. 2, which shows a schematic diagram of transmission channels of a signal transmission circuit packaging structure of the present invention.

The input pins A1_iP, A1_iN, A3_iP, A3_iN, B1_iP, B1_iN, B3_iP, B3_iN, C0_iP, C0_iN, C2_iP, C2_iN are electrically connected to the main circuit unit 20 through a first high-speed input channel 31, a second high-speed input channel 32, a third high-speed input channel 33, a fourth high-speed input channel 34, a fifth high-speed input channel 35, and a sixth high-speed input channel 36, and then electrically connected to the output pins A0_oP, A0_oN, A2_oP, A2_oN, B0_oP, B0_oN, B2_oP, B2_oN, C1_oP, C1_oN, C3_oP, C3_oN through a first high-speed output channel 41, a second high-speed output channel 42, a third high-speed output channel 43, a fourth high-speed output channel 44, a fifth high-speed output channel 45, and a sixth high-speed output channel 46. All of the high-speed input channels 31 to 36 are set in accordance with the relative positions of the input ports A1, A3, B1, B3, C0, C2 connected to the input pins A1_iP, A1_iN, A3_iP, A3_iN, B1_iP, B1_iN, B3_iP, B3_iN, C0_iP, C0_iN, C2_iP, C2_iN. Similarly, all of the high-speed output channels 41 to 46 are set in accordance with the relative positions of the output ports A0, A2, B0, B2, C1, C3 connected to the output pins A0_oP, A0_oN, A2_oP, A2_oN, B0_oP, B0_oN B2_oP, B2_oN, C1_oP, C1_oN, C3_oP, C3_oN. Thus, the structure above-mentioned is capable of reducing the distances of signal transmission and reducing the loss of signal energy.

Figure 3:
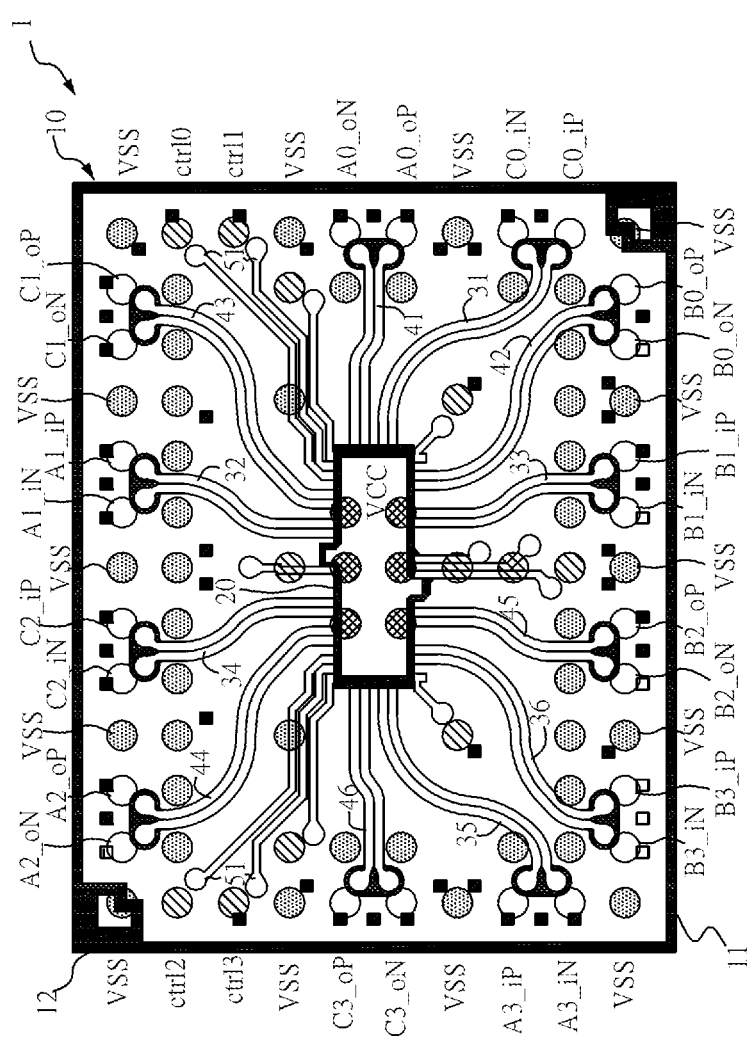
FIG. 3 is a schematic diagram that combines a pin layout and the transmission channels in a signal transmission circuit packaging structure of the present invention.

Finally, refer to FIG. 3, which shows a combination schematic diagram of a pin layout and the transmission channels in a signal transmission circuit packaging structure of the present invention.

As shown in FIG. 3, the input pins C0_iP, C0_iN of the demultiplexer circuit 21a are connected to the first high-speed input channel 31, the output pins A0_oP, A0_oN are connected to the first high-speed output channel 41, and the output pins B0_oP, B0_oN are connected to the second high-speed output channel 42. The input pins A1_iP, A1_iN of the multiplexer circuit 22a are connected to the second high-speed input channel 32, the input pins B1_iP, B1_iN are connected to the third high-speed input channel 33, and the output pins C1_oP, C1_oN are connected to the third high-speed output channel 43. The input pins C2_iP, C2_iN of the demultiplexer circuit 21b are connected to the fourth high-speed input channel 34, the output pins A2_oP, A2_oN are connected to the fourth high-speed output channel 44, and the output pins B2_oP, B2_oN are connected to the fifth high-speed output channel 45. The input pins A3_iP, A3_iN of the multiplexer circuit 22a are connected to the fifth high-speed input channel 35, the input pins B3_iP, B3_iN are connected to the sixth high-speed input channel 36, and the output pins C3_oP, C3_oN are connected to the sixth high-speed output channel 46. The plurality of input pins A1_iP, A1_iN, A3_iP, A3_iN, B1_iP, B1_iN, B3_iP, B3_iN, C0 C0_iN, C2_iP, C2_iN, the plurality of output pins A0_oP, A0_oN, A2_oP, A2_oN, B0_oP, B0_oN, B2_oP, B2_oN, C1_oP, C1_oN, C3_oP, C3_oN, and the plurality control pins ctrl0, ctrl1, ctrl2, ctrl3 are all separated by the ground pins VSS. Moreover, the high-speed input channels 31 to 36 and the high-speed output channels 41 to 46 are not close to any of the plurality of low-speed transmission channels 51 and are mutually separated by certain distances. As a result, the high-speed transmission signals will not experience interference due to crosstalk from the low-speed control signals, thus providing optimal high-speed signal quality.

It can be known from the description above that the signal transmission circuit packaging structure 1 of the present invention is capable of reducing distances of signal transmission, signal attenuation, the number of vias in a circuit board and complications in circuit layout, as well as preventing issues of crosstalk and degraded signal quality, and the design of the present invention is obviously superior to designs of the prior art.

It should be noted that the embodiments given above are examples of the present invention rather than limitations of the present invention. Any variation without departing from the fundamental structure of the invention is to be encompassed within the scope of protection in accordance with the broadest interpretation of the appended claims.

What is claimed is:

1. A signal transmission circuit packaging structure, comprising:
- a body, comprising a first side and a second side, the first side being adjacent to the second side;
- a main circuit unit, arranged in a center of the body;
- a plurality of power pins, arranged in the center of the body and supplying a power signal to the main circuit unit;
- a plurality of input pins, arranged at the first side and the second side of the body and electrically connected to the main circuit unit;
- to a plurality of output pins, arranged at the first side and the second side of the body and electrically connected to the main circuit unit;
- a plurality of control pins, arranged at the second side of the body and electrically connected to the main circuit unit; and
- a plurality of ground pins, arranged at corners of the body and arranged between the plurality of input pins, the plurality of output pins and the plurality of control pins so as to separate the plurality of input pins, the plurality of output pins and the plurality of control pins.

2. The signal transmission circuit packaging structure as claimed in claim 1, wherein the main circuit unit has a multiplexer circuit and a demultiplexer circuit.

3. The signal transmission circuit packaging structure as claimed in claim 2, wherein the plurality of input pins and the plurality of output pins are arranged at the same side and an adjacent side of the body.

4. The signal transmission circuit packaging structure as claimed in claim 3, wherein the plurality of input pins are electrically connected to the main circuit unit through a plurality of high-speed input channels and then electrically connected to the plurality of output pins through a plurality of high-speed output channels.

5. The signal transmission circuit packaging structure as claimed in claim 4, wherein the plurality of control pins are electrically connected to the main circuit unit through the plurality of low-speed transmission channels.

6. The signal transmission circuit packaging structure as claimed in claim 5, wherein the plurality of low-speed transmission channels are separated by a predetermined distance from the plurality of high-speed input channels and the plurality of high-speed output channels.

7. The signal transmission circuit packaging structure as claimed in claim 2, wherein the plurality of input pins and the plurality of output pins are arranged at the same side and an opposite side of the body.

8. The signal transmission circuit packaging structure as claimed in claim 7, wherein the plurality of input pins are electrically connected to the main circuit unit through a plurality of high-speed input channels and then electrically connected to the plurality of output pins through a plurality of high-speed output channels.

9. The signal transmission circuit packaging structure as claimed in claim 8, wherein the plurality of control pins are electrically connected to the main circuit unit through the plurality of low-speed transmission channels.

10. The signal transmission circuit packaging structure as claimed in claim 9, wherein the plurality of low-speed transmission channels are separated by a predetermined distance from the plurality of high-speed input channels and the plurality of high-speed output channels.

* * * * *